United States Patent
Moon et al.

[11] Patent Number: 5,916,626
[45] Date of Patent: Jun. 29, 1999

[54] HMDS SUPPLYING APPARATUS

[75] Inventors: Yun-jeon Moon; Seong-il Kim; Jeong-suk Kim; Won-yeal Sin, all of Suwon, Rep. of Korea

[73] Assignee: Samsung Electronics Co., Ltd., Suwon, Rep. of Korea

[21] Appl. No.: 08/773,060

[22] Filed: Dec. 24, 1996

[30] Foreign Application Priority Data

Dec. 27, 1995 [KR] Rep. of Korea ............ 95-59509

[51] Int. Cl.$^6$ ............................................. C23C 16/00
[52] U.S. Cl. .................. 427/8; 427/248.1; 118/691; 118/708; 118/712; 118/715; 73/305; 73/307
[58] Field of Search ................... 118/691, 708, 118/712, 715; 73/305, 307; 427/10, 248.1

[56] References Cited

U.S. PATENT DOCUMENTS 5,501,739  3/1996  Yamada .................... 118/715

*Primary Examiner*—Richard Bueker
*Attorney, Agent, or Firm*—Jones, Volentine, Steinberg, & Whitt, L.L.P.

[57] ABSTRACT

An HMDS supplying apparatus capable of sensing the flow of hexamethyldisilazane through a flowmeter and to control the amount thereof which is flowing, to thereby prevent a lowering of productivity due to inadequate or excessive flow amounts. The HMDS supplying apparatus includes a carrier gas supplier for supplying a carrier gas for HMDS; a container connected to the carrier gas supplier adapted for containing HMDS therein; a flowmeter for controlling the amount of flowing HMDS supplied together with the carrier gas from the container; and an HMDS processor for depositing HMDS supplied via the flowmeter on the surface of a wafer; wherein the apparatus further includes: an indicator for indicating the level of HMDS in the flowmeter; and an optical sensing device having an optical source and an optical sensor, for controlling the flow of HMDS by sensing whether the indicator is located at an optimum position.

8 Claims, 2 Drawing Sheets

HMDS SUPPLYING APPARATUS

BACKGROUND OF THE INVENTION

The present invention relates to a hexamethyldisilazane (HMDS) supplying apparatus. More particularly, the invention relates to an HMDS supplying apparatus that senses the flow of HMDS through a flowmeter and controls the amount which is flowing.

In a semiconductor fabricating process, a photosensitive layer is formed as a pattern on a semiconductor substrate prior to additional steps in the formation of a semiconductor device. If adhesion of the photosensitive layer is weak, the layer may become separated from the semiconductor substrate during a subsequent etching step. As a result, an undesired portion of the substrate may be etched in the etching step and result in an inferior quality semiconductor device. Thus, it is very important to improve adhesion of the photosensitive layer in semiconductor fabrication. Also, an important processing parameter in the photosensitive layer deposition process is the affinity between the photosensitive layer and the surface of a wafer, since this has an effect on the pattern being formed.

Since the photosensitive layer is hydrophobic and the surface of wafer is hydrophilic, the natural affinity between the photosensitive layer and the wafer surface is not good. Thus, for the purpose of improving the affinity, an HMDS-treatment step is utilized wherein the affinity-improving agent HMDS is sprayed on the wafer surface in a vapor state.

In such a case, if HMDS is not evenly sprayed on the wafer to provide a uniform coating, the photosensitive layer may become separated from a portion of the wafer which has a weak affinity between the photosensitive layer and the wafer surface. On the other hand, if the affinity is too strong, a portion which should be removed by a developing process may in fact remain.

Generally, in order to improve the adhesion between the photosensitive layer and the wafer surface, a process of depositing HMDS on the wafer surface is performed using an HMDS supplying apparatus before depositing the photosensitive layer. For such processes, the HMDS supplying apparatus is usually installed in the photosensitive depositing apparatus.

Hereinafter, the conventional HMDS supplying process using a photosensitive layer depositing apparatus will be described in greater detail.

FIG. 1 is a structural diagram showing a conventional HMDS supplying apparatus installed in a photosensitive layer depositing apparatus.

Specifically, a container 1 for containing HMDS, which is a liquid at room temperature, is connected to a gaseous nitrogen supplying portion 3 serving as a means to supply gaseous nitrogen as a carrier gas for carrying liquid HMDS stored in the container 1. HMDS is carried from the container 1 together with gaseous nitrogen and is supplied to the wafer surface via a flowmeter 5 for monitoring the amount of HMDS which is flowing. Usually, the amount of HMDS which is flowing is monitored using a visual indicator 7 (e.g., a floating ball, represented in FIG. 1 as a triangle) which floats to a predetermined height which corresponds to the amount of gaseous nitrogen which is flowing into the flowmeter 5 together with HMDS.

HMDS passing through the flowmeter 5 is vaporized at a high temperature and then deposited on the wafer surface in an HMDS processor 9. The remaining gaseous HMDS is eliminated via a waste line 15 due to its toxicity to the human body. Subsequent to such treatment, a photosensitive layer is deposited on the HMDS-treated wafer in a spin portion 17.

In the gaseous nitrogen supplying portion 3, gaseous nitrogen flows in thereto via a regulator 21 and a gaseous nitrogen flowmeter 23 in sequence. The gaseous nitrogen then flows to the container 1 via a filter 27 by the operation of a valve 25.

As described above, in the conventional HMDS supplying apparatus, gaseous nitrogen supplied from the gaseous nitrogen supplying portion 3 passes through the flowmeter 5 via the container 1 containing liquid HMDS. In such an apparatus, the flowing of HMDS via the flowmeter 5 can be monitored by visually inspecting the ball 7 of the flowmeter 5, which floats to a height proportional to the amount of HMDS flowing through the flowmeter 5.

Thus, while the photosensitive layer depositing apparatus is operating, if HMDS does not flow or is interrupted due to an error in, the apparatus supplying the HMDS, the HMDS flow cannot be monitored effectively. As a result, the photosensitive layer may be poorly deposited and cause to become separated during the photolithography process. As discussed above, this can cause the production of inferior semiconductor devices. Since there is no device for automatically detecting an abnormality in the HMDS flow in the conventional HMDS supplying apparatus, if a malfunction occurs during the photolithography process, the productivity for semiconductor devices is lowered.

SUMMARY OF THE INVENTION

To solve the above problem, it is an object of the present invention to provide an HMDS supplying apparatus which automatically controls the flow of HMDS through a flowmeter, which prevents the lowering of productivity in the manufacture of semiconductor devices.

To achieve the above object, there is provided a hexamethyldisilazane (HMDS) supplying apparatus having a carrier gas supplier for supplying a carrier gas for HMDS, a container connected to the carrier gas supplier, for containing HMDS therein, a flowmeter for controlling the amount of flowing HMDS which is supplied together with the carrier gas from the container, and an HMDS processor for depositing HMDS that is supplied via the flowmeter onto the surface of a wafer, the HMDS supplying apparatus further comprising: an indicator for indicating the level of HMDS, the indicator floatably adopted in the flowmeter; and an optical sensing device having an optical source and an optical sensor connected to the flowmeter, whereby the optical sensing device is at a same elevation as an optimum level of the indicator, such that the indicator blocks a light path between the optical source and the optical sensor.

Preferably, the optical source is a light-emitting diode or a laser diode.

According to the HMDS supplying apparatus of the present invention, inferiorities can be prevented which occur in the photosensitive layer deposition process due to a poor HMDS-treatment step. Therefore, productivity may be improved which may have the effect of reducing the cost of fabricating semiconductor devices.

Also, the step of visually inspecting the flow of HMDS can be omitted, thereby simplifying the process and decreasing the labor required.

DETAILED DESCRIPTION OF THE INVENTION

The above objects and advantages of the present invention will become more apparent by the detailed description of a preferred embodiment thereof with reference to the attached drawings.

Figure 1:
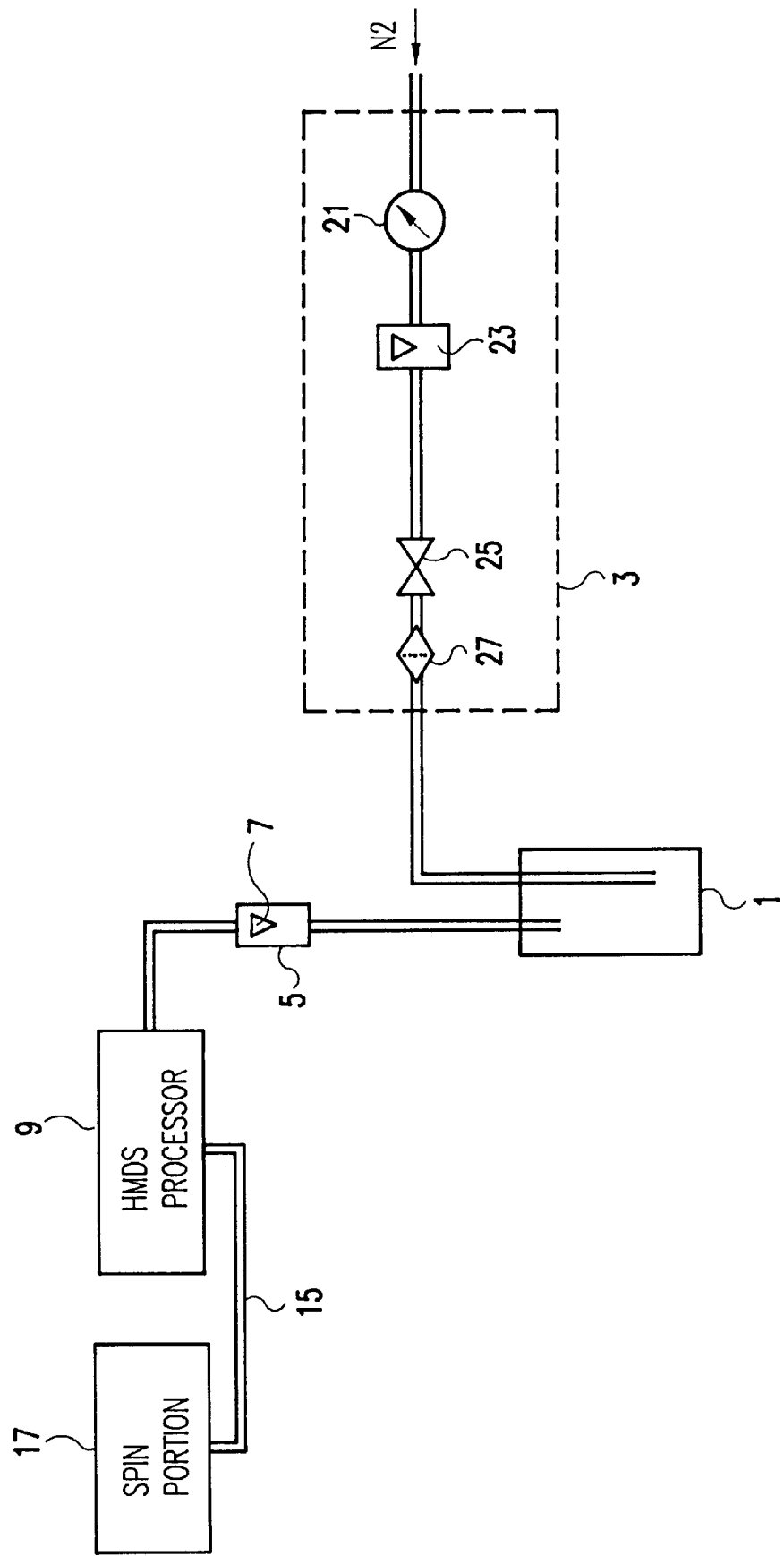
FIG. 1 is a structural diagram showing a conventional HMDS supplying apparatus installed in a photosensitive layer depositing apparatus.
Figure 2:
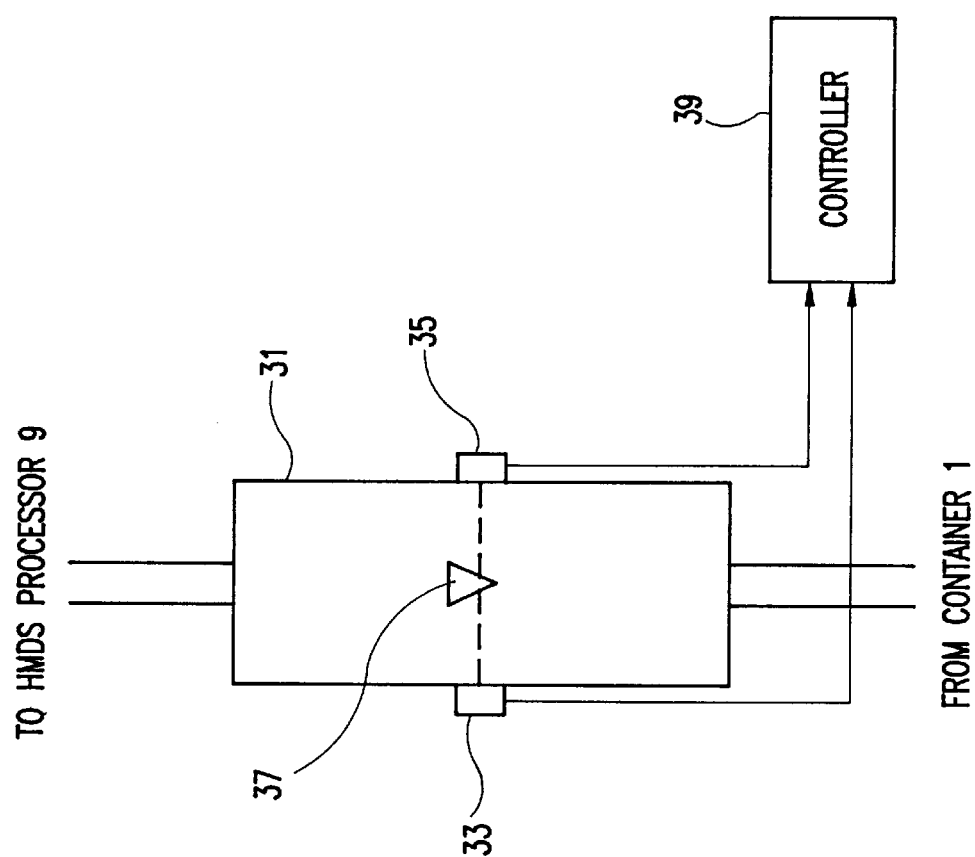
FIG. 2 is a structural diagram showing the operative portion of an HMDS supplying apparatus for sensing the flow of HMDS through a flowmeter according to the present invention.

As shown in FIG. 2, an optical sensing device is installed in an HMDS supplying apparatus according to the present invention, for sensing the flow of HMDS through a flowmeter 31, wherein HMDS is carried from a container containing liquid HMDS together with gaseous nitrogen. In the illustrated embodiment the optical sensing device is located at a predetermined height of the flowmeter 31, wherein the predetermined height at which a ball 37 floats corresponds to an optimum flow of HMDS maintained in the flowmeter 31. In FIG. 2, the ball 37 acts as an indicator which represents the amount of HMDS in the flowmeter 31. Further, the optical sensing device comprises an optical source device 33 and an optical sensor 35. In FIG. 2, the optical source device 33 may be a light-emitting diode, a laser diode, or other equivalent device.

Also, a controller 39 of the photosensitive layer depositing apparatus is connected to the optical sensing device to control a signal generated from the optical sensing device. Controller 39 also is connected to a photosensitive layer depositing apparatus to control the operation of the photosensitive layer depositing apparatus.

A method of sensing the flow of HMDS in the HMDS supplying apparatus according to the present invention may be described as follows.

When HMDS does not flow through the flowmeter 31, the optical sensor 35 senses light emitted from the optical source device 33 via the flowmeter 31. Conversely, when HMDS flows through the flowmeter 31, the ball 37 blocks the light path between the optical source device 33 and the optical sensor 35 of the optical sensing device, so that light cannot reach the optical sensor 35.

Thus, HMDS flows through the flowmeter 31 after a predetermined time lapse since the photosensitive layer depositing apparatus has performed the HMDS-treatment with respect to the wafer surface. During the flow of HMDS, when the amount of HMDS in the flowmeter 31 is maintained at an optimum level, the ball 37 of the flowmeter 31 blocks the light path between the optical source device 33 and the optical sensor 35. Thus, the state where the optical sensor 35 does not sense light from the optical source device 33 represents the condition when the flow of HMDS is normal. When the light blocking ratio by the ball 37 becomes 100%, the HMDS supply stops until the light blocking ratio drops below a predetermined level. This HDMS flow interruption is used to prevent the overflowing of HMDS. By contrast, when the light blocking ratio becomes 0%, which indicates that the optical sensor 35 senses the entire light emitted from the optical source device 33, it represents the condition where HMDS is not flowing through the flowmeter. In response to such an undesired condition, the controller 39 generates a warning signal and then stops the photosensitive layer depositing apparatus.

Therefore, inferiorities occurring in the photosensitive layer deposition process step, due to a poor HMDS-treatment step, can be prevented by utilizing an HMDS supplying apparatus according to the present invention. As a result, productivity can be improved, which can have the effect of reducing the fabricating cost.

Moreover, the additional step of visually inspecting the flow of HMDS can be omitted to thereby simplify the process.

While this invention has been described with respect to that which is presently considered to be the most practical and preferred embodiments, the invention is not limited to such disclosed embodiments. It is clearly understood that many variations can be possible within the scope and spirit of the present invention by any one skilled in the art. In fact, it is intended that the present invention should cover various modifications and equivalent arrangements within the spirit and scope of the appended claims.

What is claimed is:

1. A hexamethyldisilazane (HMDS) supplying apparatus comprising: a carrier gas supplier for supplying a carrier gas for HMDS; a container connected to said carrier gas supplier for containing HMDS therein; a flowmeter for controlling the amount of flowing HMDS supplied together with the carrier gas from said container; and an HMDS processor for depositing HMDS supplied via said flowmeter onto the surface of a wafer; wherein said HMDS supplying apparatus further comprises:

an indicator for indicating the level of HMDS, said indicator floatably adopted in said flowmeter; and an optical sensing device having an optical source and an optical sensor connected to said flowmeter, whereby said optical sensing device is at a same elevation as an optimum level of said indicator, such that said indicator blocks a light path between said optical source and said optical sensor.

2. An HMDS supplying apparatus as claimed in claim 1, wherein said optical source is a light-emitting diode.

3. An HMDS supplying apparatus as claimed in claim 1, wherein said optical source is a laser diode.

4. An HMDS supplying apparatus as claimed in claim 1, further comprising a controller connected to said optical sensing device to control the operation of a photosensitive layer depositing apparatus.

5. An HMDS supplying apparatus as claimed in claim 4, wherein said photosensitive layer depositing apparatus is stopped in response to a first signal generated from said optical sensing device.

6. An HMDS supplying apparatus as claimed in claim 1, wherein said HMDS flow is stopped in response to a second signal generated from said optical sensing device.

7. A method of sensing the flow of hexamethyldisilazane (HMDS) in a flowmeter in a HMDS supplying apparatus for controlling the operation of a photosensitive layer depositing apparatus, the method comprising the steps of:

supplying HMDS to the HMDS supplying apparatus;

emitting light from an optical source in the flowmeter;

sensing the amount of emitted light received by an optical sensor in the flowmeter; and stopping the operation of the HMDS supplying apparatus in response to a first signal from said sensing step.

8. The method of sensing the flow of HMDS as in claim 7, further including the step of;

stopping the operation of the photosensitive layer depositing apparatus in response to a second signal from said sensing step.

* * * * *